United States Patent
Chidambarrao et al.

(10) Patent No.: US 7,768,041 B2
(45) Date of Patent: Aug. 3, 2010

(54) MULTIPLE CONDUCTION STATE DEVICES HAVING DIFFERENTLY STRESSED LINERS

(75) Inventors: Dureseti Chidambarrao, Weston, CT (US); David M. Onsongo, Byron, MN (US)

(73) Assignee: International Business Machines Corporation, Armonk, NY (US)

( * ) Notice: Subject to any disclaimer, the term of this patent is extended or adjusted under 35 U.S.C. 154(b) by 956 days.

(21) Appl. No.: 11/425,511

(22) Filed: Jun. 21, 2006

(65) Prior Publication Data

US 2007/0296001 A1 Dec. 27, 2007

(51) Int. Cl.
*H01L 31/00* (2006.01)
(52) U.S. Cl. .............. 257/241; 257/402; 257/E29.105; 257/18; 438/938
(58) Field of Classification Search .......... 257/241, 257/402, E29.105, 18, 20; 438/938
See application file for complete search history.

(56) References Cited

U.S. PATENT DOCUMENTS

| | | | |
|---|---|---|---|
| 4,551,641 A | 11/1985 | Pelley, III | |
| 5,042,011 A | 8/1991 | Casper et al. | |
| 5,741,738 A | 4/1998 | Mandelman et al. | |
| 6,449,202 B1 | 9/2002 | Akatsu et al. | |
| 6,573,172 B1* | 6/2003 | En et al. | 438/626 |
| 6,984,564 B1 | 1/2006 | Huang et al. | |
| 7,002,209 B2 | 2/2006 | Chen et al. | |
| 2004/0026765 A1* | 2/2004 | Currie et al. | 257/616 |
| 2005/0098774 A1* | 5/2005 | Lochtefeld et al. | 257/19 |
| 2005/0104095 A1 | 5/2005 | Ng et al. | |
| 2005/0158937 A1 | 7/2005 | Yang et al. | |
| 2005/0158955 A1 | 7/2005 | Yang et al. | |
| 2005/0242340 A1 | 11/2005 | Chidambarrao et al. | |
| 2006/0006420 A1* | 1/2006 | Goto | 257/204 |
| 2006/0099793 A1 | 5/2006 | Yang et al. | |

OTHER PUBLICATIONS

U.S. Appl. No. 11/160,055, filed Jun. 7, 2005, entitled: "Structure And Method Of Making Field Effect Transistor Having Multiple Conduction States" and which names Dureseti Chidambarrao et al. as inventors.

* cited by examiner

*Primary Examiner*—Lex Malsawma
*Assistant Examiner*—Robert Huber
(74) *Attorney, Agent, or Firm*—H. Daniel Schnurmann; Daryl K. Neff

(57) ABSTRACT

A field effect transistor ("FET") is provided which includes an active semiconductor region including a channel region, a first source-drain region and a second source-drain region. A major surface of the active semiconductor region is divided into a mutually exclusive first portion and a second portion. A first liner applies a first stress to the first portion of the major surface, and a second liner applies a second stress to the second portion of the major surface. The first and second stresses are each selected from high tensile stress, high compressive stress and neutral stress, with the first stress being different from the second stress. The liners can help to differentiate a first operating current conducted by the first portion of the FET under one operating condition and a second operating current that is conducted by the second portion of the FET under a different operating condition.

13 Claims, 7 Drawing Sheets

MULTIPLE CONDUCTION STATE DEVICES HAVING DIFFERENTLY STRESSED LINERS

BACKGROUND OF THE INVENTION

The present invention relates to transistor devices, and more particularly to a field effect transistor device having multiple conduction states.

Transistors are a basic building block of both digital and analog circuits. In analog circuits, transistors are frequently used as linear amplifiers in which a transistor is biased to remain always "on" in a linear region of operation. On the other hand, in digital circuits, transistors are most commonly used as on-off switches. However, for certain applications, a circuit function is needed which cannot be neatly classified as either linear amplification or on-off switching. For such applications, multiple transistors can be arranged in a circuit together to accomplish a required function. However, circuits which utilize a greater number of transistors tend to occupy a larger area of the chip than those circuits which utilize fewer transistors. Moreover, on an integrated circuit or "chip", circuits which include multiple transistors can be replicated many thousands or millions of times. The decision to implement a circuit function requiring a greater number of transistors must be weighed against its affect on the area utilization of the whole chip, as it may force additional decisions to reduce the area occupied by other circuitry on the chip.

U.S. Pat. No. 5,741,738 to Mandelman et al. describes a problem of "corner" conduction in field effect transistors ("FETs") formed in semiconductor regions bounded by shallow trench isolations. Along the vertically oriented edges of the shallow trench isolations at the "corners" of the device, an uncorrected FET can exhibit higher than usual leakage current when the transistor is biased in an "off" state, due to unwanted low-level conduction at the corners. By definition, the corner conduction is an uncontrolled effect along vertical edges of a transistor device, in contrast to the normal controlled conduction which occurs substantially in the direction of a plane just below a gate dielectric at the major surface of the transistor. The corner conduction serves no useful purpose. One focus of the prior art has been to correct for or eliminate the effects of corner conduction, since it is an unwanted, uncontrolled parasitic effect.

SUMMARY OF THE INVENTION

A field effect transistor ("FET") is provided which includes an active semiconductor region including a channel region, a first source-drain region and a second source-drain region. A major surface of the active semiconductor region is divided into a mutually exclusive first portion and a second portion. A first liner applies a first stress to the first portion of the major surface, and a second liner applies a second stress to the second portion of the major surface. The first and second stresses are each selected from high tensile stress, high compressive stress and neutral stress, with the first stress being different from the second stress. The liners can help to differentiate a first operating current conducted by the first portion of the FET under one operating condition and a second operating current that is conducted by the second portion of the FET under a different operating condition.

DETAILED DESCRIPTION

In accordance with an embodiment of the invention, a transistor is provided which can be used to perform a circuit function which previously required multiple transistors to implement. The novel transistor device, specifically, a field effect transistor ("FET") device, is provided which has at least three discrete operational states instead of the two "on" and "off" states of conventional transistors. The three discrete states include: a) an essentially nonconductive state in which the FET conducts little or no current; b) a "low-conductive" or "off" state in which the FET is operated by a gate-source voltage exceeding a first threshold voltage such that the FET conducts, but with reduced current; and c) a "high-conductive" state in which the FET is operated by the gate-source voltage exceeding a second threshold voltage as well as the first threshold voltage such that the FET conducts significantly greater amount of current than the reduced current amount. The first and second threshold voltages are effective at the same time, because the first and second threshold voltages are determined by the structure that simultaneously exists in different parts of the transistor. Thus, the FET moves between the off state, the low conductive state and the high conductive state without needing to be "programmed" or "reprogrammed" in the interim.

Figure 1:
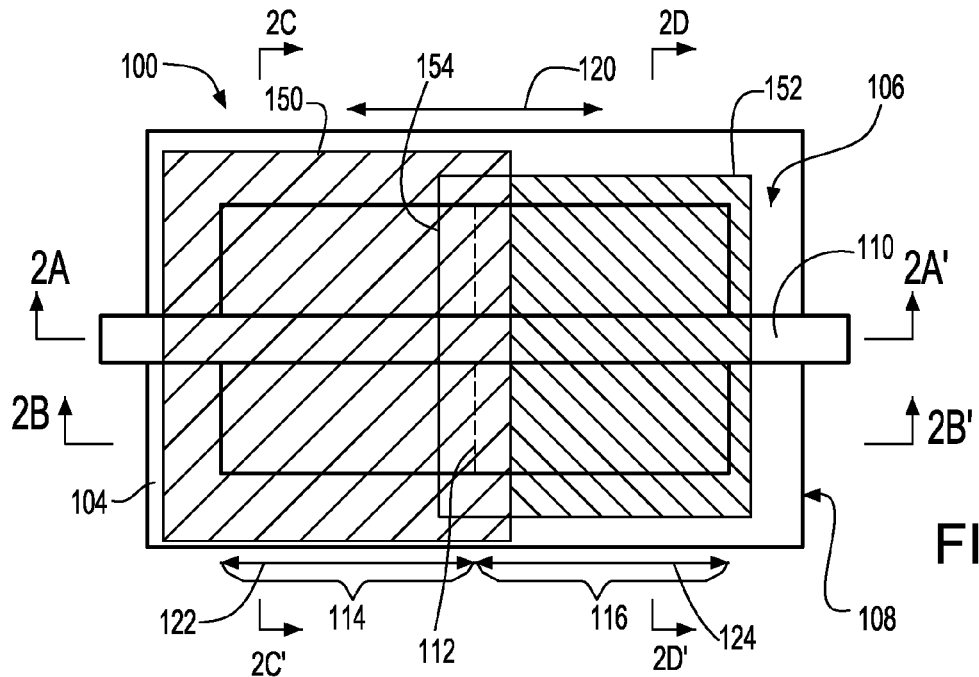
FIG. 1 is a face-up plan view of a field effect transistor ("FET") having differently stressed liners applied to different portions thereof, in accordance with an embodiment of the invention.
Figure 2A:
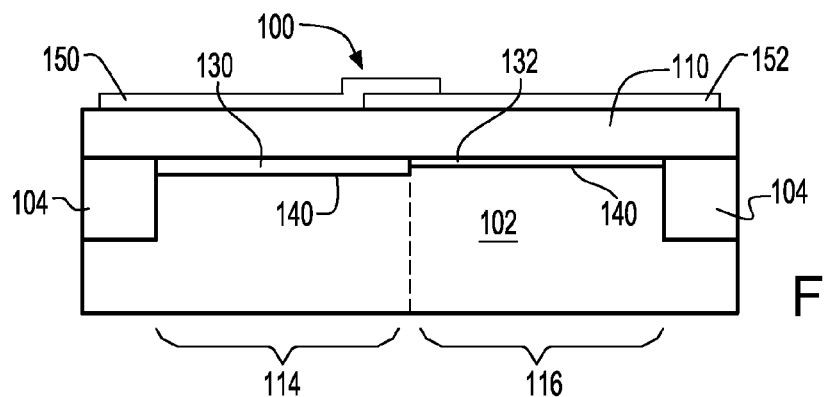
FIG. 2A is a corresponding sectional view of the FET shown in FIG. 1 through line 2A-2A' of FIG. 1.
Figure 2B:
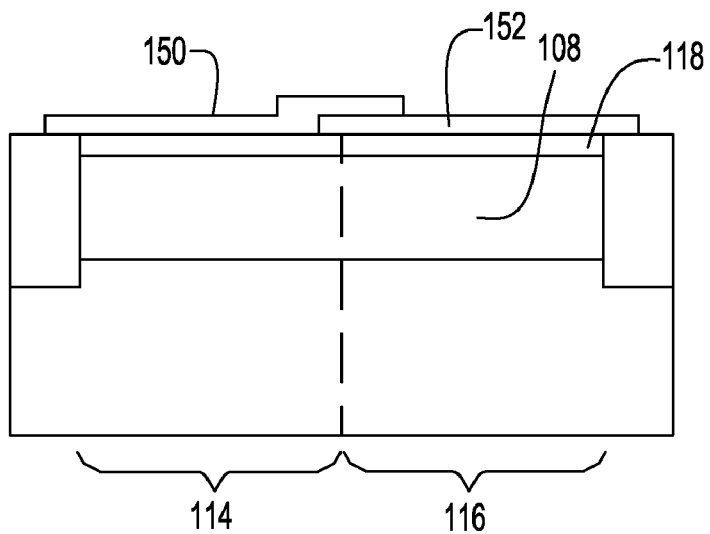
FIG. 2B is a corresponding sectional view of the FET shown in FIG. 1 through line 2B-2B' of FIG. 1.
Figure 2C:
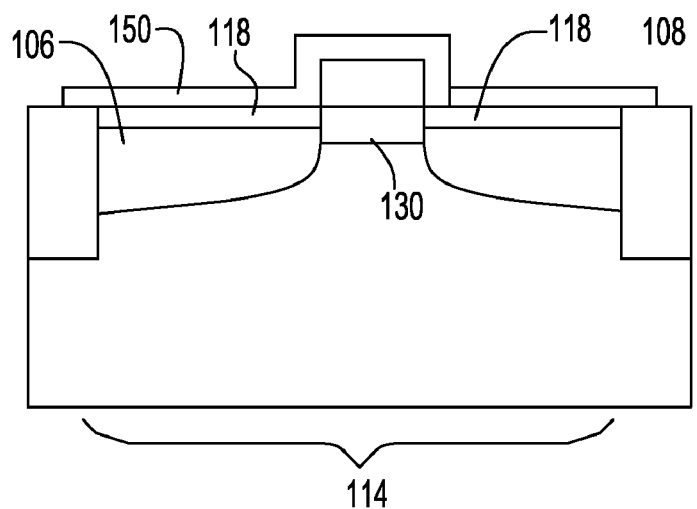
FIG. 2C is a corresponding sectional view of the FET shown in FIG. 1 through line 2C-2C' of FIG. 1.
Figure 2D:
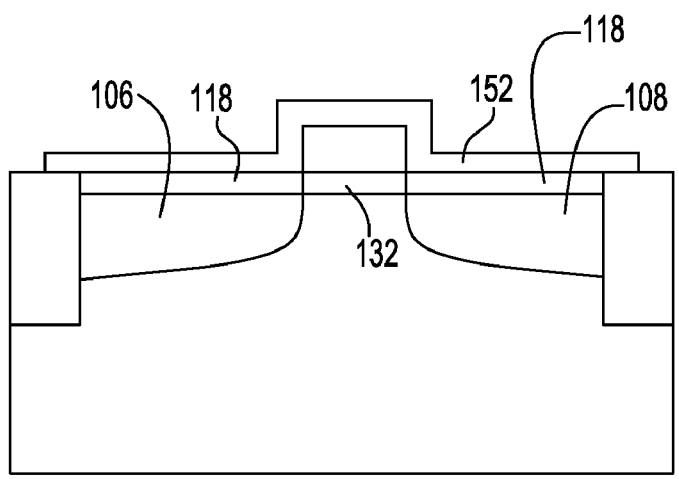
FIG. 2D is a corresponding sectional view of the FET shown in FIG. 1 through line 2D-2D' of FIG. 1.

Referring to FIG. 1, a first preferred embodiment of the invention will now be described. FIG. 1 is a top-down plan view illustrating a device structure of an FET 100 in accordance with one embodiment of the invention. FIG. 2A is a corresponding sectional view of FET 100 through line 2A-2A', FIG. 2B is a corresponding sectional view of FET 100 through line 2B-2B', FIG. 2C is a corresponding sectional view of FET 100 through line 2C-2C', and FIG. 2D is a corresponding sectional view of FET 100 through line 2D-2D'. FET 100 is disposed in an active semiconductor region 102 (illustrated in the corresponding sectional views of FIG. 2A-2C; not visible in FIG. 1) of a substrate such as a chip or wafer. The active semiconductor region 102 is isolated and preferably bounded via an isolation structure 104 such as shallow trench isolation ("STI"). The FET can either be an n-type field effect transistor ("NFET") or a p-type field effect transistor ("PFET"). A first source-drain region 106 and a second source-drain region 108 are disposed within the semiconductor region, these regions occupying respective portions of the semiconductor region separated by a gate conductor 110. The active semiconductor region of the FET depicted in FIG. 1 includes two portions 114, 116 of the transistor delineated by dotted line 112. The two transistor portions extend in an at least generally planar direction at the upper surface (140; FIG. 2A) of the active semiconductor region 102.

As further shown in FIG. 1, a first liner 150 overlies the first transistor portion 114 and a second liner 152 overlies the second transistor portion 116. Preferably, as illustrated in FIG. 1, the second liner 152 overlaps an edge 154 of the first liner 150. Alternatively, the liners 150, 152 can be formed in such way that the edges of both liners abut each other, rather than one of the liners overlapping the other. The first and second liners are formed in such way as to intentionally have mutually different internal stress values. Each liner preferably has an internal stress value that is selected from high compressive stress, high tensile stress and neutral stress. In a particular embodiment illustrated in FIGS. 1 and 2A through 2D, the first liner 150 has a tensile stress, and the second liner 152 has a compressive stress. The tensile stress value of the first liner preferably ranges between about 1 GPa and 2 GPa and the compressive stress value of the second liner preferably ranges between about −2 GPa and −4 GPa. However, tensile liners having stress values with higher positive values or compressive liners having lower (more negative) values can be utilized if available. Each of the liners preferably includes an internally stressed material and preferably consists essentially of silicon nitride, the silicon nitride acting as a barrier to diffusion of dopants or potential contaminants to the active semiconductor region 102 of the FET 100. The purposes of the liners and their effect on operation will be described in detail below.

The two portions 114, 116 of the FET operate according to different threshold voltages. The first portion 114 has a structure that results in such portion turning on upon exceeding a first threshold voltage, conducting a first operating current when turned on. The second portion 116 has a structure that results in such portion turning on upon exceeding a second threshold voltage, a voltage which is higher than the first threshold voltage. The second portion 116 also conducts a second operating current when it is turned on that is higher than the first operating current value. The value of the first and second threshold voltages and the amount of current to be conducted in each conductive state are selected by design a priori and are set by the particular structure of the transistor. The first operating current is relatively small in comparison to the second operating current.

Illustratively, the second threshold voltage has a magnitude which is about 100 mV to 200 mV higher than the magnitude of the first threshold voltage. Illustratively, the amount of the second operating current is significantly greater than the amount of the first operating current, e.g., one to two orders of magnitude greater. Preferably, the difference between the magnitude of the second operating current and that of the first operating current is not as high as the difference in current, e.g., about 1000 times, between that of a fully turned "on" transistor and the subthreshold leakage current of a transistor, i.e., one that is considered to be in the "off" state.

The first and second portions of the FET represent a functional division of the FET in a direction of the width of the FET. In one preferred embodiment, the width 122 of the channel region within the first portion 114 is about equal to the width 124 of the channel region within the second portion 116. However, in other embodiments described below, the difference between these widths 122, 124 varies.

FIG. 2A provides a corresponding sectional view of FET 100 through lines 2A-2A' of FIG. 1. As depicted in FIG. 2A, the semiconductor region 102 is bounded by an STI region 104. As also shown therein, the gate conductor 110 overlies the semiconductor region 102 and is separated therefrom by a gate dielectric. In the embodiment shown in FIG. 2A, the gate dielectric overlying both the first portion 114 and the second portion 116 is at least substantially co-planar. The gate dielectric has a first portion 130 having a first nominal thickness and a second portion 132 having a second nominal thickness, the second nominal thickness being substantially thinner than the first nominal thickness. In a particular example, the thin second gate dielectric portion 132 has thickness of about 10 angstroms and the thicker first gate dielectric portion has a thickness between about 15 angstroms and 50 angstroms, preferably being about 1.5 to 5 times thicker than the gate dielectric of the second portion. Preferably, the second nominal thickness is about 1.5 to about five times the first nominal thickness. The thicknesses of each portion 130, 132 of the gate dielectric preferably are controlled independently in accordance with the process embodiments described below. In one embodiment, the boundary between the first and second portions marks a step difference in thickness. The first portion 130 of the gate dielectric extends across the first portion 114 of the transistor, while the second portion 132 of the gate dielectric extends across the second portion 116 of the transistor.

FIG. 2B is a corresponding sectional view of FET 100 line 2B-2B' of FIG. 1. As illustrated in FIG. 2B, the first liner 150 contacts a surface of a conductive silicide layer 118 that overlies the source-drain region 108 within the first transistor portion 114 and the second liner 152 contacts the silicide layer 118 overlying the source-drain region 108 within the second transistor portion 116 of the FET.

FIG. 2C is a corresponding sectional view of FET 100 through line 2C-2C' of FIG. 1. As shown therein, the first liner 150 contacts the silicide layer 118 overlying the source-drain regions 106 and 108 within the first transistor portion 114 of the FET. The first transistor portion 114 is that over which the thicker first gate dielectric portion 130 is used.

FIG. 2D is a corresponding sectional view of FET 100 through line 2D-2D' of FIG. 1. As shown therein, the second liner 152 contacts the silicide layer 118 overlying the source-drain regions 106 and 108 within the second transistor portion 116 of the FET. The second transistor portion 114 is that over which the thinner second gate dielectric portion 132 is used.

Dopant concentrations near a top surface 140 of the semiconductor region 102 preferably vary between the first portion 114 and the second portion 116 of the FET. These dopant concentrations are those which are normally established through a process known as a "threshold voltage adjustment implant" process. Such process is conducted here, for example, by protecting the portion of the transistor to receive the lower dose by a patterned mask, e.g., a photoresist layer, when the higher dose is implanted. After this process, in one example, the resulting dopant concentration near the top surface 140 of the second portion has a value significantly higher, e.g., between about 1.5 times and about 100 times higher than the dopant concentration near the top surface of the first portion. In a particular example, the dopant concentration near the top surface 140 of the first portion 114 has a value of about $1 \times 10^{17}$ cm$^{-3}$ and the dopant concentration near the top surface 140 of the second portion 116 has a value of about $7 \times 10^{18}$ cm$^{-3}$.

The differently stressed first and second liners 150, 152 further assist in determining the amounts of the first and second operating currents and the difference between them. In a particular embodiment, the FET can be a "PFET" having a p-type conductivity channel. In such case, a first liner 150 having a high tensile stress, e.g., having a stress from about 1 GPa to about 2 GPa and a second liner 152 having a high compressive stress from about −2 GPa and about −4 GPa can be used to differentiate the values of the first and second operating currents.

By virtue of such structure, the FET 100 behaves in a manner similar to a first FET and a second FET having their gate terminals, drain terminals and source terminals conductively tied together for operation in parallel, in which the first FET has a relatively low threshold voltage and low on-current, and the second FET has a higher threshold voltage and higher on-current than that of the first FET. Specifically, a first portion 114 of the transistor 100, having the thicker gate dielectric and lower dopant concentration, operates in a manner similar to a separate transistor which has a first threshold voltage, the first portion turning on and conducting a current within the first portion of the transistor when the voltage between the source and gate of the transistor exceeds the first threshold voltage. On the other hand, the second portion 116 of the transistor, having the thinner gate dielectric and higher dopant concentration, operates in a manner similar to a separate transistor which has a second threshold voltage having a higher magnitude than the first threshold voltage, the second portion turning on and conducting a current within the second portion of the transistor only when the voltage between the gate and the source of the transistor exceeds the second threshold voltage.

The value of the second threshold voltage corresponding to the second portion of the transistor 100 is higher than the first threshold voltage because of the difference in the thicknesses of the gate dielectric layer overlying each portion, as well as the difference in the concentrations of a dopant used to perform the voltage threshold adjustment implant in the first portion 114 of the transistor relative to the second portion 116.

Thus, FET 100 is a single transistor which has multiple discrete threshold voltages, making the FET operable in accordance with multiple discrete conduction states and at predetermined discrete output current levels. Hence, the FET has at least three discrete operational states including an essentially nonconductive state, a first conductive state, and a second conductive state. In the first conductive state, the gate-source voltage does not exceed either the first threshold voltage or the second threshold voltage, such that the FET is essentially nonconductive. In this state, the current between the source and the drain of the FET is negligible. As used herein, a "negligible" current is a current which is below a level which meaningfully affects function of the circuit which includes the FET. In this state, while some current may be conducted between the source and the drain of the FET as a "leakage current," the FET is considered to be "off" for the purposes to the FET is utilized within a circuit.

In the first conductive state, the gate-source voltage exceeds the first threshold voltage but does not exceed the second threshold voltage. In this state, the transistor operates in a "low conduction" mode, since only the first portion of the transistor having the first threshold voltage is turned on, whereas the second portion of the transistor has not yet turned on at the time. In this low conduction mode, since only the first portion of FET is biased above its threshold voltage, the transistor conducts only a relatively low amount of current. This is true whether the FET is biased with a relatively low voltage between the drain and the source, a moderate voltage, or is biased in saturation. The range of the current which is conducted for different values of the drain-source voltage up to a saturation value remains relatively low. Typically, the value of the current at this time is about 100 or more times greater than the "leakage current" which is conducted when the transistor is nominally in the "off" state as described above.

On the other hand, the second conductive state is a "high" conduction mode in which the gate-source voltage exceeds both the first threshold voltage and the second threshold voltage. As a result, both the first portion and the second portion of the transistor are now turned on, such that the transistor is fully conductive. In this high conduction mode, because both the first portion and the second portion of the FET are biased above their respective threshold voltages, the transistor conducts a relatively high amount of current. Consequently, a relatively high amount of current is conducted by the FET, whether the FET is biased with a relatively low voltage between the drain and the source or is biased in saturation. In this state, the current ranges between relatively high values for different values of the drain-source voltage up to a saturation value, such values ranging from about one to several orders of magnitude higher than the values of the current in the low conduction mode.

According to a particular embodiment of the invention, the first and second portions 130, 132 of the gate dielectric are fabricated by thermal oxidation of the semiconductor material present at the top surface, i.e., the "major surface" 140 of the semiconductor region 102. Thermal oxidation is performed by heating the substrate while exposing the major surface 140 of the semiconductor region 102 to an oxygen-containing ambient such as an atmosphere containing gaseous oxygen, oxygen ions, or a compound of oxygen such as steam or other compound of oxygen. When the active semiconductor region 102 consists essentially of a semiconductor material such as silicon, the material of the resulting gate dielectric becomes an oxide of silicon. More preferably, a majority percentage of the oxide of silicon formed thereby is silicon dioxide, a material considered to have good properties as a gate dielectric, more preferably, it is a high majority percentage, and most preferably substantially all of the oxide formed by this process is a dioxide of silicon. In an alternative embodiment, instead of an oxidation, a thermal nitridation is performed via a similar process to form a layer preferably having a substantial or high percentage of stoichometric silicon nitride overlying the semiconductor region as a gate dielectric.

However, particular processing must be conducted in order to form the different thicknesses of the gate dielectric on the respective portions of the semiconductor region. In one embodiment, in which a thermal oxide is formed as described above over the active semiconductor region 102, a masked implant is performed into the top surface 140 of the second portion 116 of the FET to implant an oxidation retardant therein. In the preferred embodiment in which the semiconductor region consists essentially of silicon, a masked implant is performed to implant nitrogen ions only the top surface 140 of the second portion 116 of the FET. At that time, the top surface 140 of the first portion 114 of the semiconductor region is masked by a masking layer, e.g., a patterned photoresist layer, so that first portion 114 does not receive the implant. After the ion implanting step, the masking layer is removed and the thermal oxidation is performed in the above-described manner.

With the nitrogen present in the second portion 116, the semiconductor material present at the top surface 140 in the second portion does not oxidize as rapidly as the semiconductor material present in the first portion of the FET. As a result, the thickness of the first portion 130 of the oxide gate dielectric layer which overlies the first portion 114 becomes greater than the thickness of the portion 132 of the oxide gate dielectric layer which overlies the second portion 116.

Alternatively, a masked oxidation process can be used to form the oxide gate dielectric layers 130, 132 of different thicknesses without implanting an oxidation retardant such as nitrogen. In such embodiment, the top surface 140 of the semiconductor region is oxidized by a first oxidation followed by a second oxidation. Illustratively, this process can be performed in one of two exemplary ways. In the first example, the first portion 114 of the semiconductor region is masked by an appropriate masking layer, and the first oxidation is conducted to form the thick oxide gate dielectric layer 130 overlying the first portion 114 of the semiconductor region. Thereafter, the masking layer is removed and the second oxidation is performed to form the thinner oxide 132 overlying the second portion 116 of the semiconductor region. During the second oxidation, some or all of the first portion 116 may be oxidized further, increasing the thickness of the oxide gate dielectric layer 130 overlying the first portion, since the first portion 114 is not protected by a masking layer at the time. Alternatively, in a second example, without first applying a masking layer the first oxidation is conducted to form a thin oxide gate dielectric layer 132 overlying both the first portion 114 and the second portion 116 of the semiconductor region. Thereafter, a masking layer is applied to cover the second portion 116 of the semiconductor region and then the second oxidation is performed to form the thicker oxide gate dielectric layer 130 which overlies the first portion 114 of the semiconductor region. Finally, the masking layer is removed. Various combinations and permutations of these processes using a masked oxidation to form the two portions 130, 132 of the oxide gate dielectric layer are also possible.

In yet another alternative process, a masked thermal nitridation process is used to form portions 130, 132 of a nitride gate dielectric layer having different thicknesses, instead of using thermal oxidation. When the semiconductor region 102 consists essentially of silicon, the resulting gate dielectric layer consists essentially of silicon nitride. This alternative process is performed in a manner similar to any of the above-described masked thermal oxidation processes except that in this process a source of gaseous nitrogen, nitrogen atoms, or nitrogen-containing molecules is supplied to the top surface 140 of the semiconductor region 102 during the thermal nitridations.

The differently stressed liners 150, 152 are formed after the gate dielectric layers 130, 132 and the gate conductor are formed, and typically also after the active semiconductor region 102 has been implanted in areas of the active semiconductor region which will become the source-drain regions 106, 108 of the FET. The liners are formed by blanket depositing a stressed silicon nitride material or stressed oxide material to a desirable thickness, the stressed material typically exhibiting a stress value when deposited which is close to the value of stress that the liner will have in the final product. In one example, the second liner is formed prior to forming the first liner, as indicated in the description of the fabrication method described below. Of course, the decision concerning which of the first and second liners should be formed first is usually a matter of preference only. Thus, in another example, the first liner is formed prior to forming the second liner without affecting the results of processing method or the FET constructed in accordance therewith.

In one exemplary process of forming the first and second liners, the first liner material is blanket deposited to overlie the silicide layer 118 and gate conductor 110 over both the first transistor portion 114 and second transistor portion 116 of the FET 100. Thereafter, a photoimageable material such as a photoresist is deposited and patterned by photolithography to expose the first liner material overlying most or all of the second transistor portion 116 and the first liner material is then removed from the silicide layer 118 overlying the second transistor portion, after which the photoimageable layer is removed. Following this step, the second liner material is blanket deposited to overlie the silicide layer 118 and gate conductor over both the first and second transistor portions 114, 116. Finally, another photoimageable material such as photoresist is deposited and patterned by photolithography to expose a portion of the second liner in locations corresponding to most or all of the first transistor portion 116. Temperature, flow rates and concentrations of gases, power settings or other parameters can be modulated during the process of depositing the nitride in order to achieve the desired stress in each liner. Processes for forming liners having different stresses are known.

In a variation of the above-described embodiment, the second liner 152 has a high tensile stress, preferably between about 1 GPa and about 2 GPa, such that it applies a tensile stress to the channel region of the FET 100 in the second transistor portion 116. In such case, the first liner 150 can be compressive stressed, preferably having a stress of between about −2 GPa and about −4 GPa, such that it applies a compressive stress to the channel region of the FET 100 in the first transistor portion 116.

In another variation of the above-described embodiment, one of the first and second liners has a high tensile stress, preferably between about 1 GPa and about 2 GPa. The other liner, by comparison has neutral stress. "Neutral" stress is a stress which, ideally, is close to zero GPa. The term "low" stress indicates a stress having somewhat greater magnitude than neutral stress. Nevertheless, "low" stress falls within a range between about 1 GPa and about −2 GPa. Low stress does not significantly increase or decrease the first or second operating current in percentage terms in the portion of the transistor affected by the liner. According to another variation of this embodiment, either the first liner or the second liner has a compressive stress, while the other one of the first and second liners has neutral stress.

Figure 3:
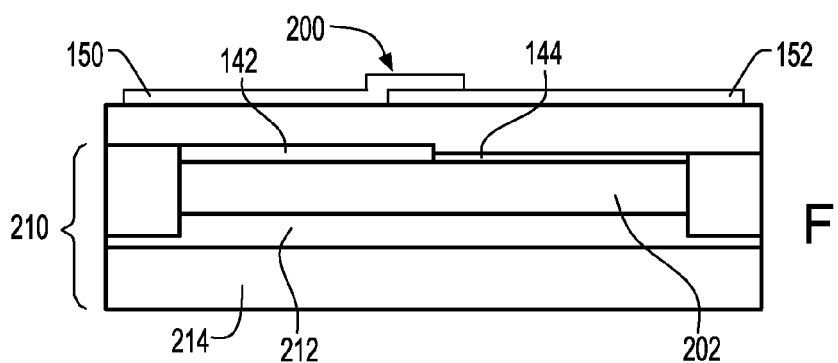
FIG. 3 is a sectional view of a FET according to a variation of the FET illustrated in FIGS. 1 and 2A through 2D.

FIG. 3 illustrates a transistor 200 according to a variation of the above embodiment in which the gate dielectric is deposited rather than formed by thermal processing of the material at the surface of the semiconductor region. In the variation shown in FIG. 3, the different thicknesses of the different portions of the gate dielectric are achieved through deposition. Namely, a first portion 142 of the deposited gate dielectric has a first thickness and a second portion 144 of the gate dielectric has a second thickness substantially thinner than the first thickness. As a deposited gate dielectric, the choices of materials available therefor are much greater than that available for use in the above-described thermal process embodiment. Thus, the gate dielectric can include an oxide of a material other than a semiconductor or can include a nitride of a material other than a semiconductor. For example, the gate dielectric can include any one or more of many well-known dielectric materials having a high dielectric constant, i.e., having a high permittivity in relation to the permittivity of silicon dioxide. Examples of such materials include, but are not limited to hafnium oxide, hafnium silicates, zirconium oxide, perovskite materials, ferroelectric dielectric materials, zeolites, lead zirconium titanate or "PZT" and all other well-known high-dielectric constant materials.

Of course, the gate dielectric need not contain a high dielectric constant material. Instead, the gate dielectric can include a deposited oxide of a semiconductor or a deposited nitride of a semiconductor. In another alternative, the gate dielectric may include both an oxide of silicon and an oxide of nitride, and may have a structure such as an "O—N—O" structure having a layered structure of silicon oxide, silicon nitride and silicon oxide in order.

As further shown in the variation shown in FIG. 3, the active semiconductor region of the transistor 200 is provided as a semiconductor-on-insulator ("SOI") layer 202 of a substrate 210 which includes a buried dielectric layer 212 which isolates the SOI layer from a bulk region 214 of the substrate 210. In a particular embodiment, the SOI layer and the bulk region consist essentially of silicon and the buried dielectric layer consists essentially of an oxide of silicon, the buried dielectric layer preferably being at least mostly silicon dioxide. As in the above-described embodiment, differently stressed liners 150, 152 overlie respective portions of the transistor defined by the different portions 142, 144 of the gate dielectric.

Figure 4:
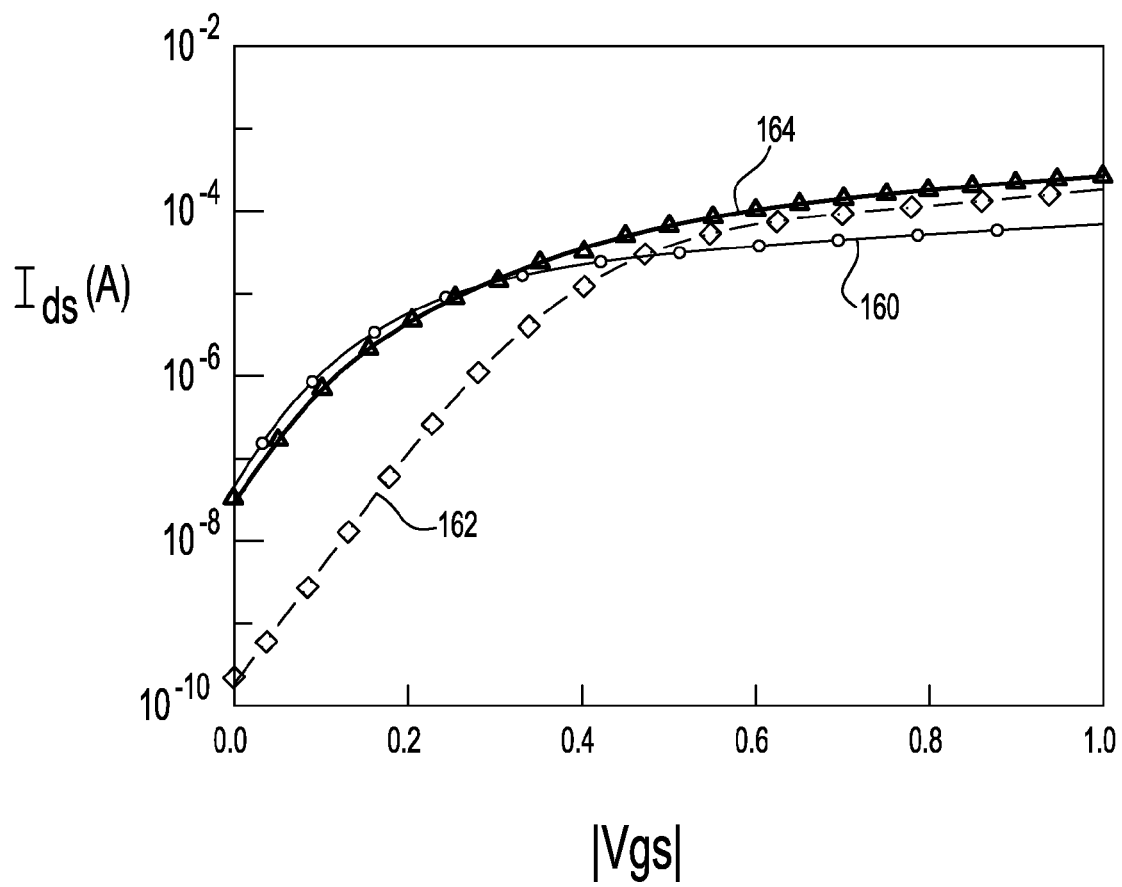
FIG. 4 is a graph illustrating conduction states of a FET in accordance with the embodiment of the invention illustrated in FIGS. 1 and 2A through 2D.

FIG. 4 is a graph illustrating an example of operation of the FET shown in the embodiment described above with respect to FIGS. 1 through 2D or FIG. 3. Specifically, FIG. 4 graphs a current versus voltage characteristic of the FET. Current is graphed on a logarithmic scale in relation to the gate to source voltage (|Vgs|) which is graphed linearly. Vgs is graphed in terms of its magnitude for ease of reference because the curves are representative of operation whether the FET is an NFET or a PFET. Three curves are shown in FIG. 4. A first curve 160 represents the current versus voltage characteristic for the first portion of the transistor having the thicker gate dielectric and the lower dopant concentration. A second curve 162 represents the current versus voltage characteristic for the second portion of the transistor having the thinner gate dielectric and the higher dopant concentration. A third curve 164 represents the current versus voltage characteristic for the entire transistor, being the sum of the current voltage characteristics for the first and second portions of the transistor combined.

The first threshold voltage of the FET occurs at approximately 0.2 volts in that for values of the gate to source voltage (|Vgs|) which exceed that level, the first portion of the transistor turns on but conducts a relatively small amount of current. Under that biasing condition, the second portion of the transistor remains off. Under this condition, the FET conducts a current of about 10 microamperes ($\mu$A). This operational condition continues until |Vgs| exceeds the second threshold voltage at about 0.4 to 0.5 volts. When the second threshold voltage is exceeded, the second portion of the transistor turns on, and conducts a current which is substantially greater than the current that the first portion conducts. Thus, the current conducted by the second portion of the transistor becomes the dominant current when |Vgs| exceeds the second threshold voltage, that current being about ten or more times larger than the current already being conducted by the first portion of the transistor.

Figure 5:
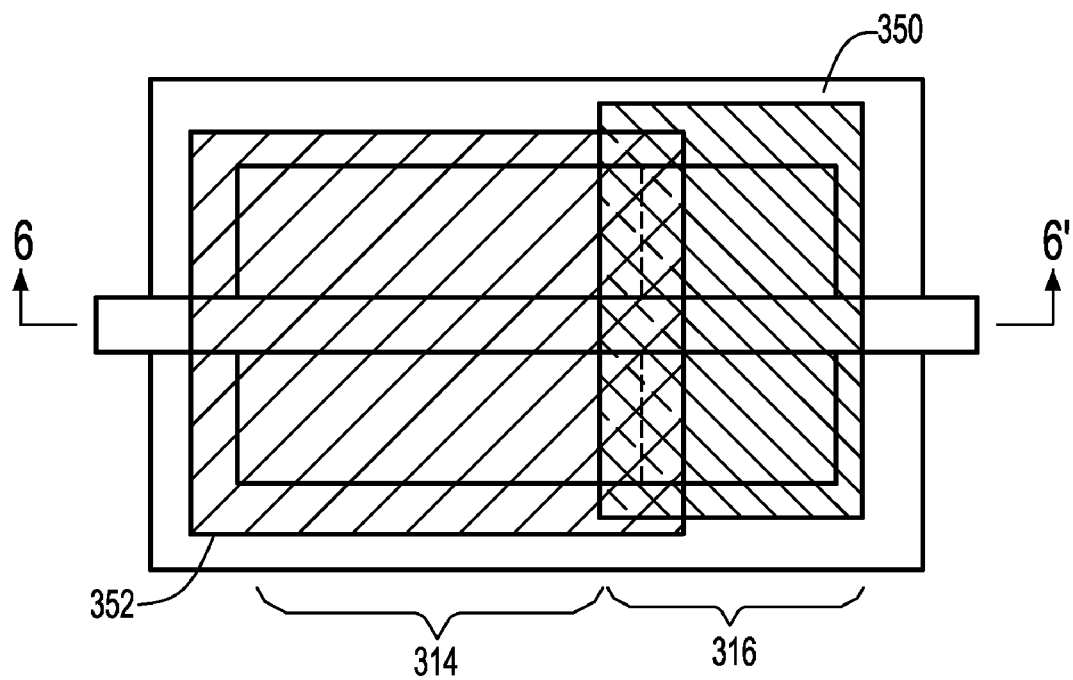
FIGS. 5 and 6 are a face-up plan view and a corresponding sectional view through line 6-6' of FIG. 5, respectively, illustrating a variation of the embodiment illustrated in FIGS. 1 and 2A through 2D.
Figure 6:
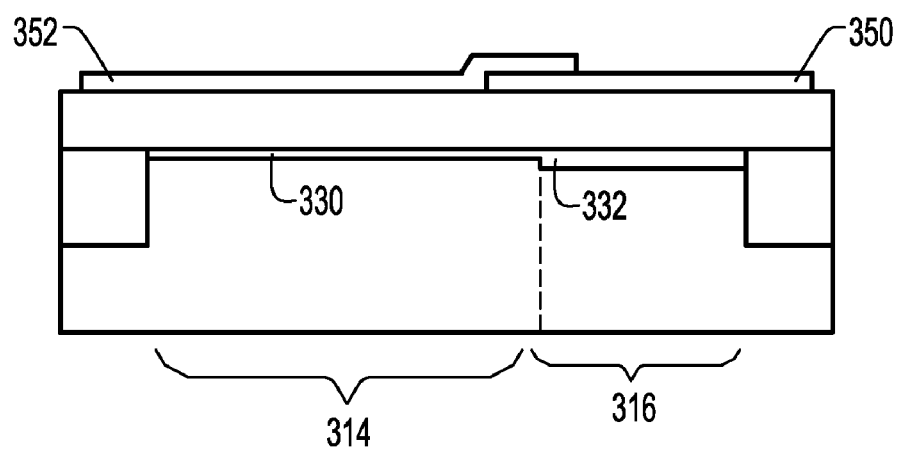

FIGS. 5 and 6 illustrate a variation of the above-described embodiment. In the embodiments shown in FIGS. 1-2D or 3, each of the first and second portions of the transistor extends over about half the width of the transistor channel. However, there is no requirement that these widths be the same. In order to tailor the operating current that is obtained when the FET is operated in each of the low and high conductive states, the width of either the first portion or the second portion of the channel region can be made larger than that of the other portion. Referring to the face-up plan view of FIG. 5, in one example, the first portion 316 can occupy an area of the semiconductor region selected between about 10% and about 80% of the total area of the semiconductor region at the major surface, the major surface defining a substantially planar top surface over which the gate dielectric is disposed. In the particular example shown, the first portion 316 of the transistor extends over about 30% of the channel width and the second portion 314 extends over the other 70% of the channel width. As shown in the corresponding sectional view of FIG. 6 through lines 6-6 of FIG. 5, the thicker portion 332 of the gate dielectric extends only over about 30% of the transistor channel width, while the thinner portion 330 of the gate dielectric extends about 70% of the transistor channel width. Similar to the embodiment described above with reference to FIGS. 1-2D and 3, the dopant concentration in each of the first and second portions varies correspondingly.

As further shown in FIGS. 5 and 6, a first liner 350 overlies the first transistor portion 316, the first liner having a similar construction to that described in the first embodiment of the invention. Specifically, the first liner 350 has a first stress selected from high compressive stress, high tensile stress and neutral stress. A second liner 352 overlies the second transistor portion 314, the second liner also having a similar construction to that described in the first embodiment of the invention. In particular, the second liner also has a second stress selected from high compressive stress, high tensile stress and neutral stress, but which is a different one of high compressive, high tensile or neutral stress from that of the first stress.

Figure 7:
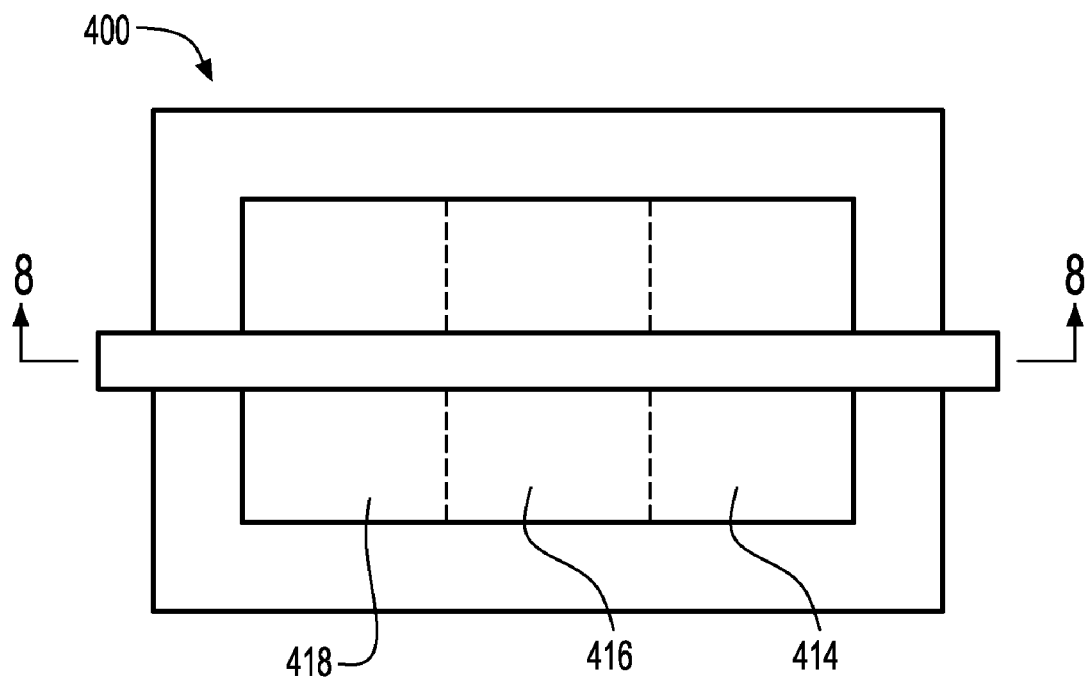
FIGS. 7 and 8 are a face-up plan view and a corresponding sectional view through line 8-8' of FIG. 7, respectively, illustrating a further variation of the embodiment illustrated in FIGS. 1 and 2A through 2D.
Figure 8:
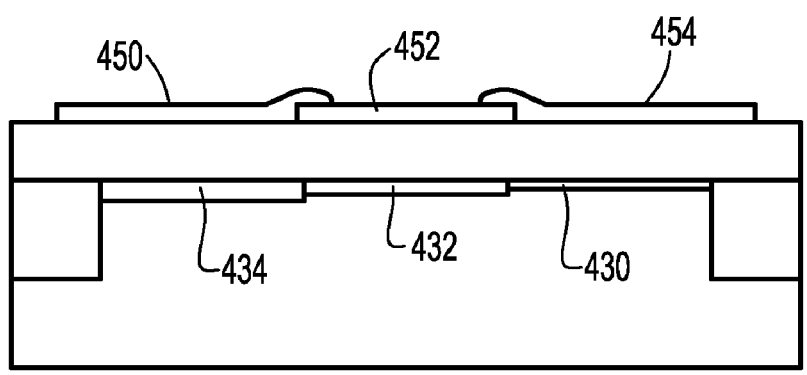

FIG. 7 is a top-down plan view illustrating a variation of the above embodiment in which the semiconductor region of a field effect transistor 400 includes three portions 414, 416 and 418 having correspondingly varied dopant concentrations similar to that described above. As shown in the corresponding sectional view of FIG. 8 through line 8-8 of FIG. 7, each of the three portions of the transistor has a corresponding portion 430, 432 and 434 of the gate dielectric, each such portion of the gate dielectric having a different thickness from each other portion. FIG. 8 illustrates an embodiment in which the gate dielectric is formed by a thermal process of oxidation and/or nitridation such that some of the material at the top surface 440 of the semiconductor region 402 is consumed, in a manner similar to that shown in FIG. 2. Alternatively, as shown in FIG. 9, each of the three portions 450, 452 and 454 of the gate dielectric, each having a different thickness, can be formed by deposition, in a manner similar to that described above with reference to FIG. 3. Corresponding liners overlie each of the respective portions of the transistor, the liners having stresses selected from high compressive, high tensile and neutral stress. In one embodiment, each of the first, second and third liners 450, 452 and 454 applies a different stress to the FET, the stresses applied by the liners being selected from high tensile, high compressive and neutral. For example, preferably, when the FET is a PFET, liner 450 applies a high compressive stress, liner 452 applies a neutral stress and liner 454 applies a high tensile stress. In another embodiment, when the FET is an NFET, liner 450 applies a high tensile stress, liner 452 applies a neutral stress and liner 454 applies a high compressive stress. In another variation of such embodiment, both the first and third liners can apply high tensile stress or high compressive stress and the second liner can apply a neutral stress to the respective transistor portions.

In yet another embodiment, the first, second and third liners can apply any other combination of high tensile, high compressive and neutral stresses to the respective transistor portions, and multiple ones of the liners can apply the same type (high tensile, high compressive or neutral) stress to the respective portions of the FET.

Referring to FIG. 7 again, each of the portions 414, 416, and 418 of the transistor turns on at a different threshold voltage such that transistor 400 has a lowest, a middle, and a highest threshold voltage. The transistor 400 has three discrete conduction states determined by whether the voltage applied between the gate and the source exceeds only the lowest threshold voltage of the transistor, exceeds the middle threshold voltage, or exceeds the highest threshold voltage. In each case, the conduction states are discrete and the threshold voltages mark discrete boundaries of operation in that a significant difference in the amount of current conducted by the transistor occurs upon the gate-source voltage |Vgs| exceeding each of the lowest, middle and highest threshold voltages. Note that these conduction states of the transistor are in addition to the one "off" state it has when the voltage applied between the gate and the source does not exceed any of the threshold voltages of the transistor. By extension, according to the principles described herein, in another embodiment the transistor can be fabricated to have an even greater number of discrete portions, for example five, the transistor having a corresponding number of thicknesses of the gate dielectric and correspondingly varied dopant concentrations in each portion, for operating in a correspondingly greater number of discrete conduction states.

Figure 9A:
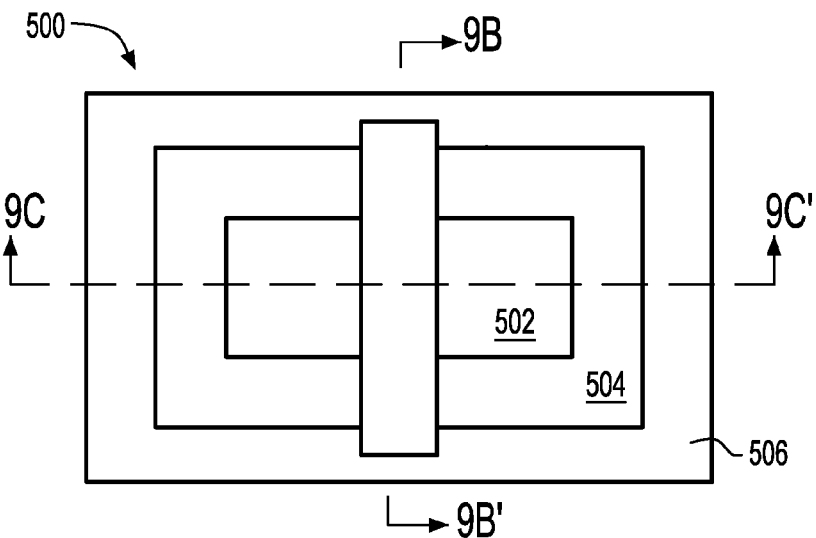
FIGS. 9A, 9B and 9C are a face-up plan view and corresponding sectional views through line 9B-9B' and through line 9C-9C' of FIG. 9A, respectively, illustrating a further variation of the embodiment illustrated in FIGS. 1 and 2A through 2D.
Figure 9B:
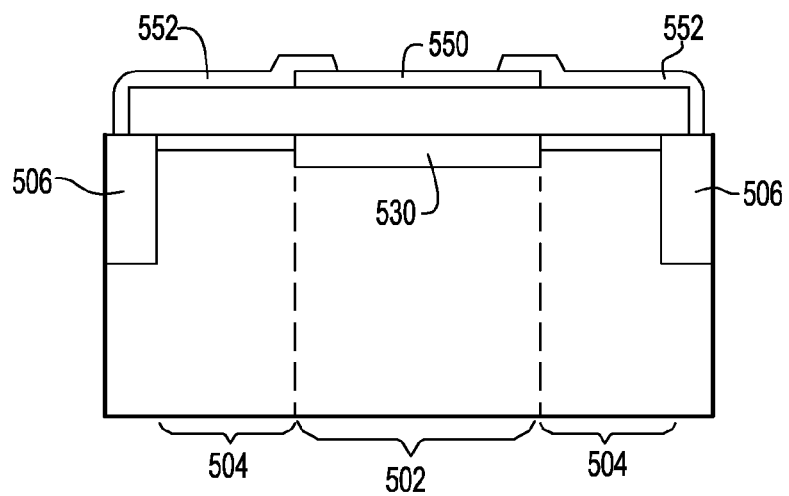
Figure 9C:
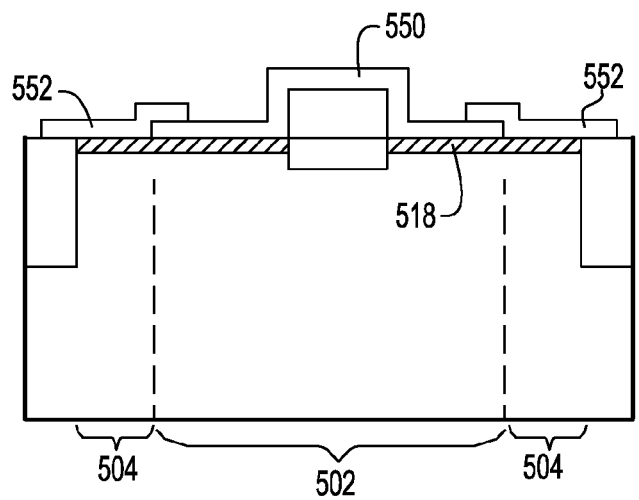

FIGS. 9A-9C illustrate a FET structure 500 in accordance with another variation of the embodiment of the invention described above with reference to FIGS. 1-2D. In this embodiment, the gate conductor extends in the north-south direction across the active area of the transistor, rather than in the east-west direction as in the above embodiments. A first portion 502 of the transistor has a corresponding relatively thick first gate dielectric portion 530 (FIG. 9B). The first transistor portion 502 occupies a central portion of an active semiconductor region which is bounded by an isolation region such as a trench isolation region or shallow trench isolation ("STI") region. A corresponding dopant implant is performed to the first transistor portion 502 and a corresponding first liner 550 having a stress selected from high compressive, high tensile and neutral overlies the first portion 502. A corresponding different dopant implant is performed to the second transistor portion 504 and a corresponding second liner 552 having a different stress selected from high tensile, high compressive and neutral overlies the second portion 504.

Figure 10:
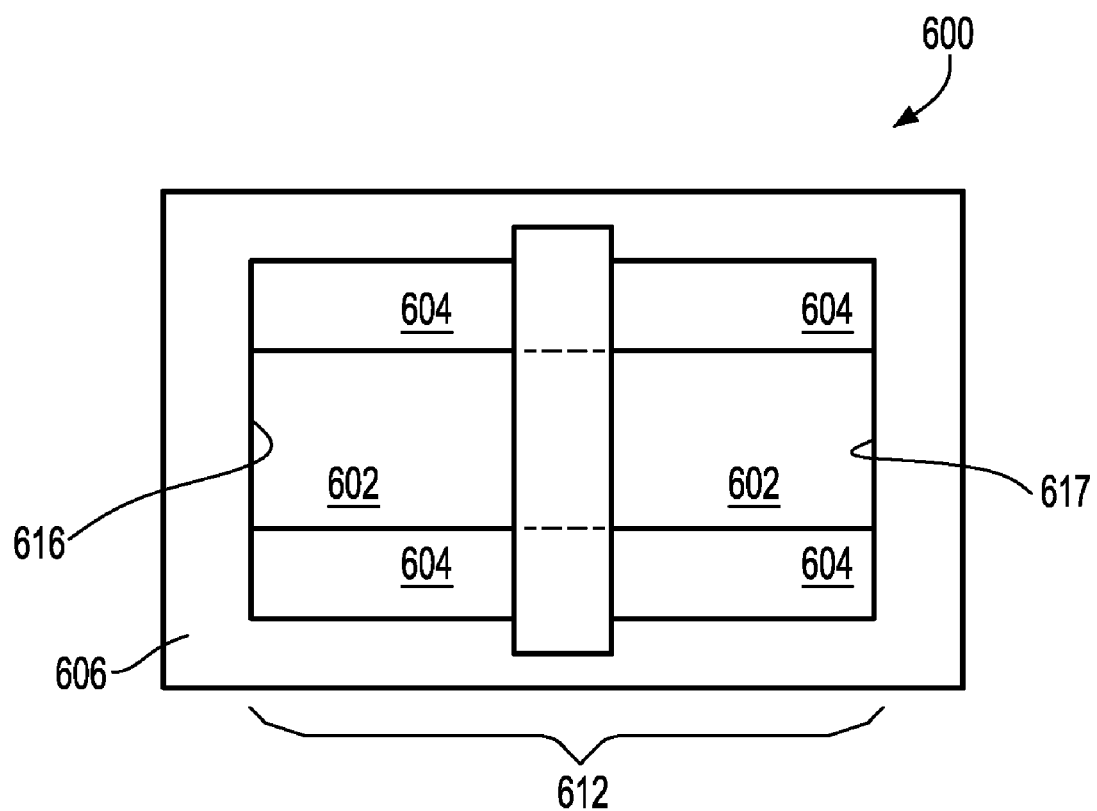
FIG. 10 is a face-up plan view illustrating a variation of the embodiment of the invention illustrated in FIGS. 9A through 9C.

FIG. 10 is a face-up plan view illustrating a FET 600 in accordance with a variation of the embodiment of the invention illustrated in FIGS. 9A-9C. Again, in this embodiment, the gate conductor extends in the north-south direction across the active area of the transistor. The first transistor portion 602 is defined as a stripe which extends from a first inner edge 616 of the STI region 606 to a second inner edge 617 of the STI region. In similar manner, the FET 600 has two second transistor portions 604 which extend as stripes from the first inner edge 616 to the second inner edge 617. Thus, the first transistor portion 602 and each of the second transistor portions 604 has the same length 612. As in the above-described embodiment, dopant implants and liners are provided which correspond to the first and second transistor portions 602, 604.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A field effect transistor ("FET"), comprising:
   a continuous active semiconductor region including only one channel region, a first source-drain region and a second source-drain region separated from said first source-drain region by said channel region, said channel region including mutually exclusive first and second portions being laterally adjacent to each other, and each said portion extending a part of a width of said channel region;
   an isolation region isolating the active semiconductor region from at least one other semiconductor device;
   a single gate conductor extending over said first and second portions of said channel region;
   a first liner overlying said first portion of said channel region, such that said first portion of said channel region has a first stress; and
   a second liner overlying said second portion of said channel region such that said second portion of said channel region has a second stress,
   wherein said first and second stresses are each selected from high tensile stress, high compressive stress and neutral stress, said first stress being different from said second stress.

2. The FET as claimed in claim 1, wherein said FET has a first threshold voltage having a first magnitude and a second threshold voltage having a second magnitude higher than said first magnitude, said first threshold voltage and said second threshold voltage being effective at the same time, said FET being operable in multiple conduction states in response to a gate-source voltage between said gate conductor and said source region including at least the states of:
   a) an essentially nonconductive state when a magnitude of said gate-source voltage is less than said first magnitude and less than said second magnitude, such that a source-drain current between said source region and said drain region has a negligible value;
   b) a first conductive state when said magnitude of said gate-source voltage is greater than said first magnitude and less than said second magnitude, in which state said source-drain current has a first operating value of about ten or more times higher than said negligible value; and
   c) a second conductive state when said magnitude of said gate-source voltage is greater than said first magnitude and said second magnitude and in which state said source-drain current has a second operating value of about ten or more times higher than said first operating value.

3. An integrated circuit including an FET as claimed in claim 1.

4. The FET as claimed in claim 1, wherein said first stress is a high compressive stress and said second stress is a high tensile stress.

5. The FET as claimed in claim 1, wherein said first stress is a neutral stress and said second stress is either a high compressive stress or a high tensile stress.

6. The FET as claimed in claim 1 wherein said semiconductor region is disposed in a semiconductor-on-insulator ("SOI") layer of a semiconductor-on-insulator ("SOI") substrate, said SOI layer separated from said SOI substrate by a buried dielectric layer of said SOI substrate.

7. The FET as claimed in claim 2, further comprising a gate dielectric disposed between said channel region and said gate conductor, said gate dielectric including a first portion overlying said first portion of said channel region and having a first thickness and a second portion overlying said first portion of said channel region and having a second thickness substantially thinner than said first thickness, wherein said first portion of said gate dielectric underlies said first liner and said second portion of said gate dielectric underlies said second liner, said first thickness at least partly determines said first threshold voltage and said second thickness at least partly determines said second threshold voltage.

8. The FET as claimed in claim 7, wherein said second thickness is between about one and one half and about five times thicker than said first thickness.

9. The FET as claimed in claim 7, wherein said first portion of said channel region has a first dopant concentration and said second portion of said channel region has a second dopant concentration substantially different from said first dopant concentration, said first dopant concentration at least partly determining said first threshold voltage and said second dopant concentration at least partly determining said second threshold voltage.

10. The FET as claimed in claim 9, wherein said second dopant concentration is greater than about one and one half times said first dopant concentration.

11. The FET as claimed in claim 10, wherein said first portion of said channel region has a first dopant concentration and said second portion of said channel region has a second dopant concentration substantially different from said first dopant concentration, wherein said first portion of said gate dielectric is at least partially aligned to said first portion of said channel region, said second portion of said gate dielectric is at least partially aligned to said second portion of said channel region, said first dopant concentration at least partly determining said first threshold voltage and said second dopant concentration at least partly determining said second threshold voltage.

12. The FET as claimed in claim 1, wherein said channel region includes a third portion, said FET further comprising a third liner applying a third stress to said third portion of said channel region, said third stress being selected from high tensile stress, high compressive stress and neutral stress, the third stress being different from at least one of the first or second stresses.

13. The FET as claimed in claim 1, wherein said first portion of said channel region is disposed between parts of said second portion of said channel region.

* * * * *